(12) United States Patent
McLeod

(10) Patent No.: US 6,582,572 B2
(45) Date of Patent: Jun. 24, 2003

(54) TARGET FABRICATION METHOD FOR CYLINDRICAL CATHODES

(75) Inventor: Paul Stephen McLeod, Berkeley, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 37 days.

(21) Appl. No.: 09/871,051

(22) Filed: May 31, 2001

(65) Prior Publication Data

US 2001/0047936 A1 Dec. 6, 2001

Related U.S. Application Data

(60) Provisional application No. 60/208,995, filed on Jun. 1, 2000.

(51) Int. Cl.[7] .................. C23C 14/34; B23K 35/14; B23P 25/00; B21D 35/00
(52) U.S. Cl. .................. 204/298.12; 204/298.09; 204/298.28; 228/56.3; 29/592; 29/428; 29/458; 29/469.5
(58) Field of Search .................. 204/298.12, 298.13, 204/298.28, 298.09, 298.22; 228/56.3; 29/592, 428, 458, 469.5

(56) References Cited

U.S. PATENT DOCUMENTS

| | | | |
|---|---|---|---|
| 4,492,620 A | 1/1985 | Matsuo et al. | 204/192 R |
| 4,500,407 A | 2/1985 | Boys et al. | 204/298 |
| 4,663,009 A | 5/1987 | Bloomquist et al. | 204/192.2 |
| 4,680,061 A | 7/1987 | Lamont, Jr. | 148/1.5 |
| 4,756,815 A | 7/1988 | Turner et al. | 204/298 |
| 4,909,314 A | 3/1990 | Lamont, Jr. | 165/80.3 |
| 5,024,747 A | 6/1991 | Turner et al. | 204/298.09 |
| 5,108,574 A | 4/1992 | Kirs et al. | 204/298.22 |
| 5,281,320 A | 1/1994 | Turner et al. | 204/298.15 |
| 5,317,006 A | 5/1994 | Kumar | 204/298.12 |
| 5,336,586 A | 8/1994 | Togawa et al. | 430/316 |
| 5,350,618 A | 9/1994 | Togawa et al. | 428/156 |
| 5,392,981 A | 2/1995 | Makowiecki et al. | 228/122.1 |
| 5,427,675 A | 6/1995 | Toyama et al. | 205/90 |
| 5,527,663 A | 6/1996 | Togawa et al. | 430/320 |
| 5,580,639 A | 12/1996 | Togawa et al. | 428/156 |
| 5,618,388 A | 4/1997 | Seeser et al. | 204/192.12 |
| 5,858,477 A | 1/1999 | Veerasamy et al. | 427/562 |
| 5,879,519 A | * 3/1999 | Seeser et al. | 204/192.12 |

* cited by examiner

*Primary Examiner*—Steven H. VerSteeg

(57) ABSTRACT

A method for fabricating cylindrical sputter targets for rotary cylindrical cathodes used in depositing a dielectric layer of desired alloy on non-planar substrates during sputtering is disclosed. The method includes forming a cooling tube having a passage within to receive a cooling medium, then fabricating multiple annular rings including each of the basic metal constituents of the desired alloy and attaching the annular rings to the cooling tube such that the exposed outer portions of the annular rings provide a homogeneous layer of the desired alloy on the non-planar substrates during sputtering.

19 Claims, 3 Drawing Sheets

TARGET FABRICATION METHOD FOR CYLINDRICAL CATHODES

RELATED APPLICATION

This application claims the benefit of U.S. Provisional Application Ser. No. 60/208,995, filed Jun. 1, 2000 under 35 U.S.C. 119(e).

FIELD OF THE INVENTION

The present invention relates to the field of mass storage devices. More particularly, this invention relates to fabrication of cylindrical targets used in sputter deposition of storage discs.

BACKGROUND OF THE INVENTION

One key component of any computer system is a device to store data. Computer systems have many different places where data can be stored. One common place for storing massive amounts of data in a computer system is on a disc drive. The most basic parts of a disc drive are an information storage disc that is rotated, an actuator that moves a transducer to various locations over the disc, and electrical circuitry that is used to write and read data to and from the disc. The disc drive also includes circuitry for encoding data so that it can be successfully retrieved and written to the disc surface. A microprocessor controls most of the operations of the disc drive as well as passing the data back to the requesting computer and taking data from a requesting computer for storing to the disc.

In the disc drive industry, high-performance, thin-film storage discs produced by depositing successive layers on a substrate apparatus for preparation of such storage discs are well known in the art. For storage discs of the type formed on a rigid disc substrate, each layer in the storage disc is deposited in a separate chamber. For example, the under-layer, the magnetic layer, and the over-layer (lubrication layer) are generally deposited in separate processing chambers. Generally, such layers are deposited onto the disc surfaces using sputtering processes.

A typical sputtering system includes a target (a cathode) and a substrate holder (an anode) positioned so that the surface of the substrate upon which the film is to be deposited is placed on the holder, facing the target. Generally the target is a plate material positioned parallel to its respective anodes. Such systems are called planar magnetron sputtering systems. The planar magnetron targets have a number of limitations. Analysis of film composition of films deposited at low pressures has revealed undesirable stoichiometric variations. At high pressures, atomic percentages of certain elements in targets after sputtering at high pressure have not been found to be uniform; that is, the various compounds appear to depart the target leaving certain elements "rich" in certain areas and those same elements "poor" in other areas. A primary problem is that the center of the target does not sputter. This leads to a buildup of layers of back scattered target species, which subsequently exfoliate causing film defects on the substrate.

Also, the planar sputter processes do not provide sufficient target utilization and film uniformity across a pallet to meet the production goals of lower cost per disc and higher magnetic property (Mrt/Hc) uniformity. To overcome the above described problems with the planar sputtering process, cylindrical cathodes made of alloys such as CoCrPtB for pass-by metal sputtering are used. Cr, Pt, and B are added to Co to control the crystal lattice size and orientation and the grain size. Pass-by sputtering is used to coat large substrate areas uniformly and quickly. By moving the substrate past the sputter target the film uniformity in the direction of travel can be very uniform if the sputter rate is held constant. If the target is long enough to span the other axis of the substrate, the coating over the substrate will be uniform. Further since the substrate can be continuously moved past the target, large areas can be rapidly coated. In this example many discs are robot-loaded into holes of a vertical plate and transported past magnetron sputter sources, which coat both sides of the disc simultaneously.

Generally, cylindrical cathodes are useful for coating substrates of complex shapes. Because, the cylindrical cathodes have uniform wall erosion rate and the object to be coated has an unobstructed view of the cathode surface. The concept of rotating cylindrical cathodes is generally known. In such a device, a cathode target assembly in the form of an elongated, cylindrical tube carries a layer of material applied to its outer surface that is to be sputtered. The target tube is rotated about its longitudinal axis.

However, so far a cylindrical sputter target made of a brittle alloy such as CoCrPtB for a rotary cylindrical cathode has not been feasible because it is generally not economical. This is because it is generally very difficult to machine alloys including chromium. Employing a fabrication process such as plasma spraying the alloy of CoCrPtB does not guarantee less than 1,000 ppm oxygen in the finished product. Oxygen is thought to form compounds in the films, which lead to undesirable shapes or orientation. During the cooling of the casting, many elements freeze sooner than other materials, and this may not result in the desired alloy uniformity. It is relatively easy to form an alloy such as CoCrPtB by mixing the powdered elements in a metal container, sealing it and pressing the container at high temperature to cause the elements to sinter. After sintering, the container is removed and the billet is rolled into sheets for making targets. Though this process can be used to cut discs with a hole in the center large enough to slide over a backing rod or tube material, it cannot be used to make hollow cylinders. Furthermore, this is an expensive process and generally not feasible.

What is needed is an economically feasible technique for fabricating rotary cylindrical cathodes made of a brittle alloy such as CoCrPtB to meet the production goals of lower cost per disc, higher Mrt/Hc uniformity, and to function reliably at typical sputtering power densities and process parameters.

SUMMARY OF THE INVENTION

One aspect of the present invention includes fabricating a non-planar sputter target for a rotary cylindrical cathode. According to the method, a cooling tube having a passage within to receive a cooling medium is formed. Then, multiple annular rings including each of the basic metal constituents of a desired alloy are formed. Then the formed annular rings are attached to the cooling tube such that the exposed outer portions of the annular rings provide a homogeneous layer of the desired alloy on a non-planar substrate when used as the rotary cylindrical cathode during sputtering.

Another aspect of the present invention is a rotary cylindrical cathode for a sputter target. The rotary cylindrical cathode comprises a cooling tube having a passage within the cooling tube to receive a cooling medium. The cooling tube further has an outer surface. The rotary cylindrical cathode further has multiple annular rings having inner and outer ring surfaces. The annular rings are made of each of the basic metal constituents of a desired alloy. The annular rings are arranged and disposed over the outer surface of the cooling tube such that outer ring surfaces of the annular rings provide a homogeneous layer of the desired alloy on a non-planar substrate during sputtering.

Advantageously, the technique described above provides an economically feasible rotary cylindrical cathode made of a brittle alloy such as CoCrPtB to meet the production goals of lower cost per disc, and at the same provide a higher Mrt/Hc uniformity in the sputtered alloy layer over the non-planar substrate. Also the technique provides a rotary cylindrical cathode that can function reliably at typical sputtering power densities and process parameters.

DESCRIPTION OF THE PREFERRED EMBODIMENT

In the following detailed description of the preferred embodiments, reference is made to the accompanying drawings, which form a part hereof, and in which are shown by way of illustration specific embodiments in which the invention may be practiced. It is to be understood that other embodiments may be utilized and structural changes may be made without departing from the scope of the present invention.

The invention described in this application is useful with all mechanical configurations of disc drives having either rotary or linear actuation. In addition, the invention is also useful in all types of disc drives including hard disc drives, zip drives, floppy disc drives and any other type of drive.

Figure 1:
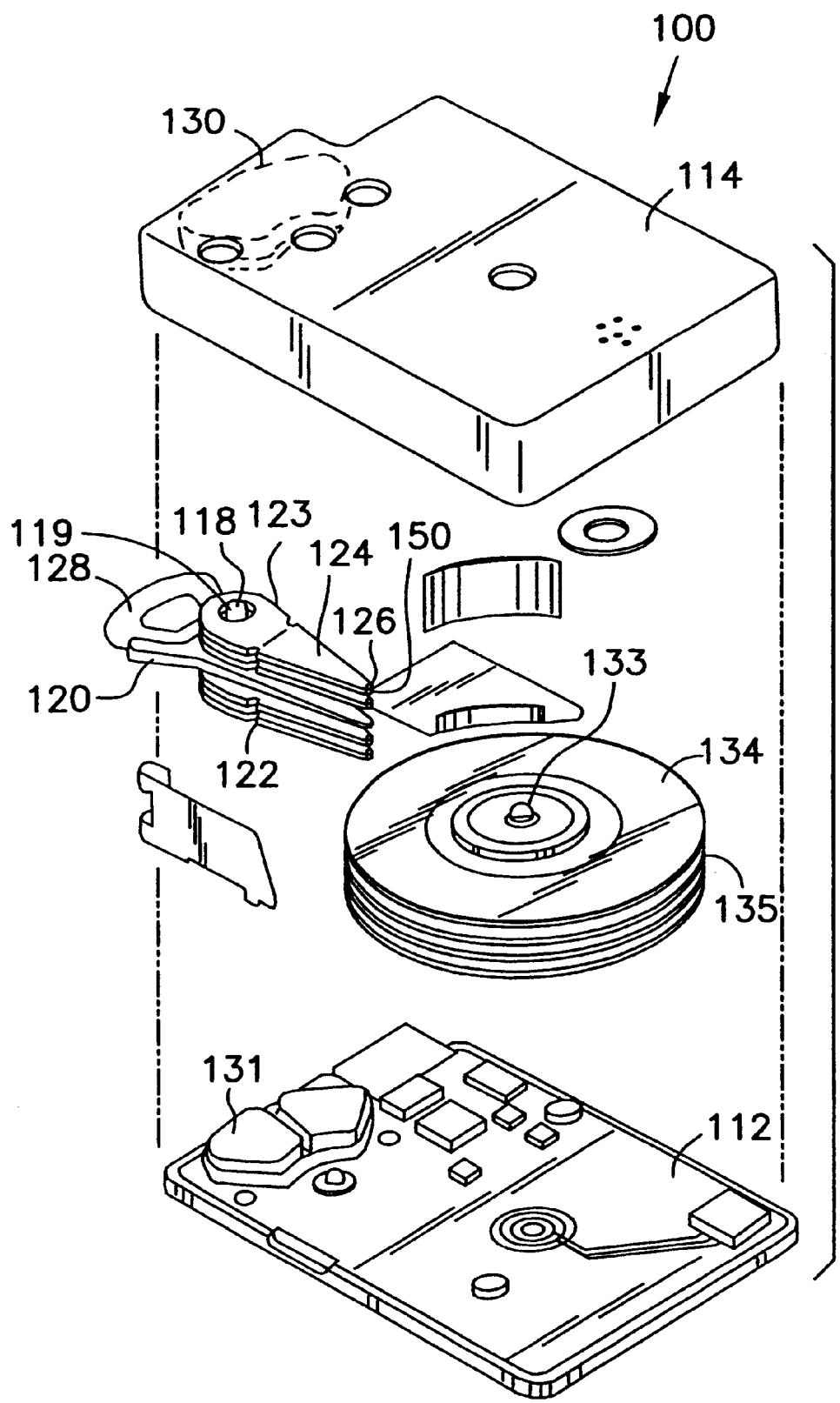
FIG. 1 is an exploded view of a disc drive with a multiple disc stack.

FIG. 1 is an exploded view of one type of a disc drive 100 having a rotary actuator. The disc drive 100 includes a housing or a base 112, and a cover 114. The base 112 and cover 114 form a disc enclosure. Rotatably attached to the base 112 on an actuator shaft 118 is an actuator assembly 120. The actuator assembly 120 includes a comb-like structure 122 having a plurality of actuator arms 123. Attached to the separate arms 123 on the comb 122, are load beams or load springs 124. Load beams or load springs are also referred to as suspensions. Attached at the end of each load spring 124 is a slider 126, which carries a magnetic transducer 150. The slider 126 with the transducer 150 form what is often called the head. The head with the load spring 124 is often called the head gimbal assembly. It should be noted that many sliders have one transducer 150 and that is what is shown in the figures. It should also be noted that this invention is equally applicable to sliders having more than one transducer, such as what is referred to as an MR or magneto resistive head in which one transducer 150 is generally used for reading and another is generally used for writing. On the end of the actuator arm assembly 120 opposite the load springs 124 and the sliders 126 is a voice coil 128.

Attached within the base 112 is a first magnet 130 and a second magnet 131. As shown in FIG. 1, the first magnet 130 is associated with the cover 114 and the second magnet 131 is associated with the base 112. The first and second magnets 130, 131, and the voice coil 128 are the key components of a voice coil motor, which applies a force to the actuator assembly 120 to rotate it about the actuator shaft 118 and the bearing cartridge 119. Also mounted to the base 112 is a spindle motor. The spindle motor includes a rotating portion called the spindle hub 133. In this particular disc drive, the spindle motor is within the hub. In FIG. 1, a number of discs 134 are attached to the spindle hub 133. Each of the discs 134 has a recording surface 135. Only one disc 134 is numbered for the sake of clarity. In other disc drives a single disc or a different number of discs may be attached to the hub. The invention described herein is equally applicable to disc drives which have a plurality of discs as well as disc drives that have a single disc. The invention described herein is also equally applicable to disc drives with spindle motors, which are within the hub 133 or under the hub.

Figure 2:
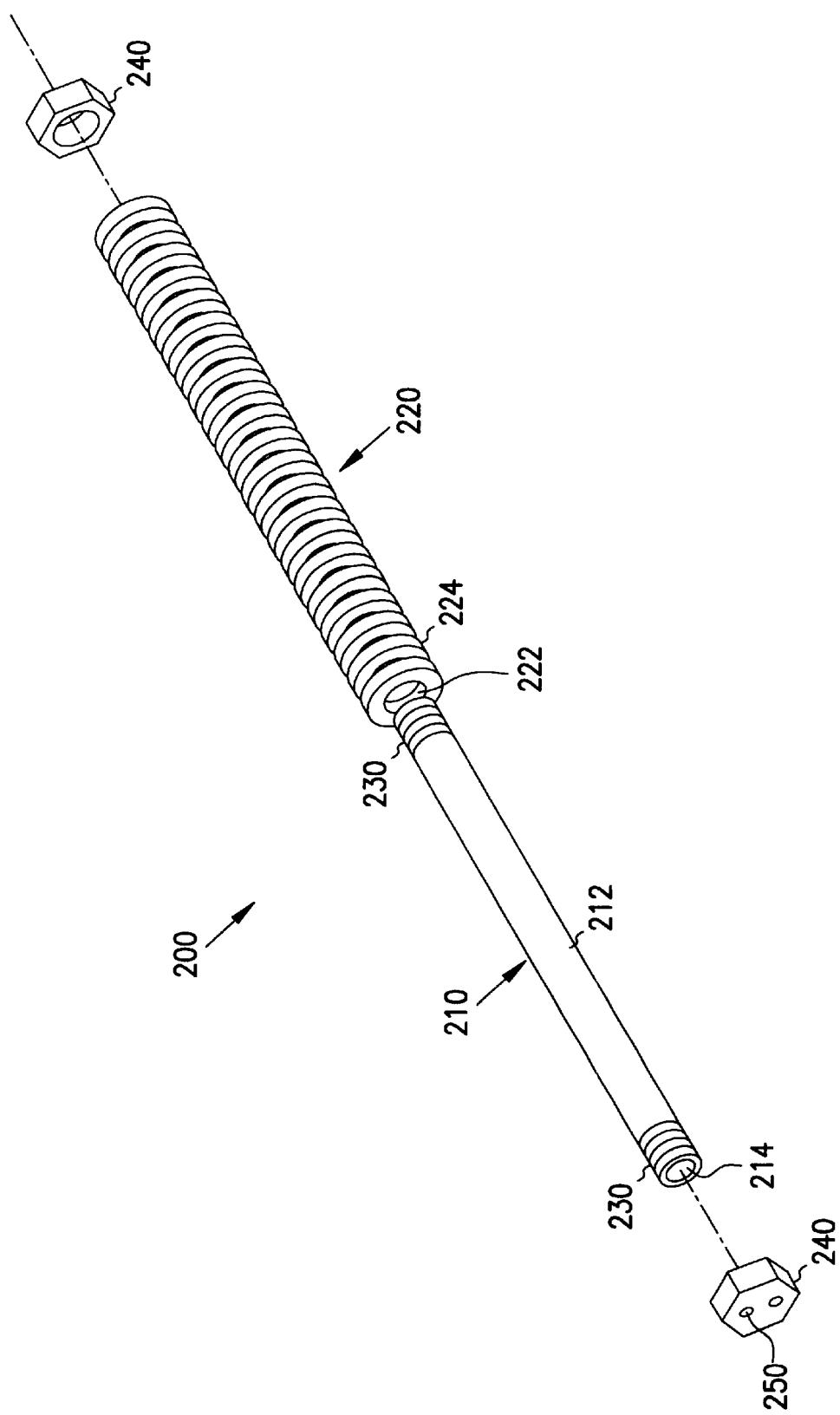
FIG. 2 illustrates one example embodiment of a fabricated sputter target of a rotary cylindrical cathode according to the teachings of the present invention.

FIG. 2 illustrates one example embodiment of a fabricated sputter target 200 for a rotary cylindrical cathode according to the teachings of the present invention. Shown in FIG. 2 are a cooling tube 210, multiple annular rings 220 made from each of the basic metal constituents of a desired alloy on a substrate, and a pair of clamping nuts 240.

In the example embodiment shown in FIG. 2, the cooling tube 210 is formed such that it has a passage 214 within to receive a cooling medium. The cooling tube has an outer surface 212. The cooling tube 210 can be made from materials such as stainless steel. In some embodiments, the cooling tube 210 can have an outside diameter of greater than or equal to ½ an inch. It can be envisioned that the outer shape of the cooling tube 210 can be of any suitable shape such as circular, square, rectangular, oval, and/or polygon. In the embodiment shown in FIG. 2, the cooling tube 210 has threaded outer ends 230 to threadedly engage a pair of clamping nuts. In some embodiments, the cooling medium comprises water.

The multiple annular rings 220 shown in FIG. 2 are fabricated using each of the basic metal constituents of a desired alloy on a substrate during sputtering. It can be envisioned that the outer shape of the annular rings 220 is not limited to a circular shape as shown in FIG. 2. The outer shape of the annular rings 220 can also be any suitable shape such as square, rectangle, oval, and/or polygon. The annular rings 220 have inner and outer ring surfaces 222, and 224, respectively.

In the example embodiment shown in FIG. 2, the multiple annular rings are made using the basic metal constituents of a brittle alloy material such as CoCrPtB. The basic metal constituents of the brittle alloy material CoCrPtB are Cobalt, Chromium, Platinum, and Boron, respectively. The annular rings made from each of the basic metal constituents of CoCrPtB are arranged in a pattern such that the arranged pattern produces the desired alloy on the substrate during the sputtering operation.

In some embodiments, the annular rings are made from materials such as iron and cobalt and chrome alloys. The present invention teaches an economically feasible technique for fabricating the annular rings from the alloy including extremely brittle materials such as chromium and cobalt. In these embodiments, a ring made of cobalt material is fabricated by machining a cobalt sheet material to produce the cobalt annular ring. In some embodiments, a ring made of platinum material is fabricated by stamping a platinum sheet material to produce the platinum annular ring. In some embodiments, a ring made of boron material is fabricated by machining a block of boron material to produce the desired boron annular ring. In some embodiments, a ring made from chromium material is fabricated by mixing boron and cobalt powdered elements in a metal container, and sealing the container. Then the fabrication process includes pressing the container at a high temperature (generally the temperature during pressing is held around their eutectic point) to sinter and produce ingots of chromium. Further, the fabrication process includes rolling the ingots to produce sheets of chromium. Which is then cut to produce the chromium annular rings. The above-described process can also be used for fabricating cobalt annular rings.

In some embodiments, the annular rings 220 are attached to the cooling tube 210 in the arranged pattern to form an economically feasible cylindrical (non-planar) sputter target 200 for a rotary cylindrical cathode. In some embodiments, the annular rings are 220 are attached to the cooling tube 210 such that the exposed portions of the annular rings provide a homogeneous layer of a desired alloy on the substrate during sputtering.

In the example embodiment shown in FIG. 2 the arranged annular rings 220 are attached to the cooling tube 210 using a pair of clamping nuts 240. The clamping nuts 240 are threadedly engaged to the threads on the outer ends 230 of the cooling tube 210. In some embodiments the clamping nuts 240 are tightened such that the annular rings 220 are compressed to form a mechanical seal between the annular rings to prevent any solder from wicking between the annular rings 220 during soldering to further bond the inner ring surfaces 222 to the outer surface 212 of the cooling tube 210.

In some embodiments, one of the clamping nuts 240 has an opening 250 to receive soldering material during soldering to further bond the cooling tube 210 to the annular rings 220. In some embodiments, the soldering material comprises indium. Indium is preferred over other traditional soldering materials because indium melts at low temperatures, and is soft when compared to other commonly used soldering materials. Further, indium does not over-stress the formed joints after it cools down, and has better wetting properties over the other traditional soldering materials.

Figure 3:
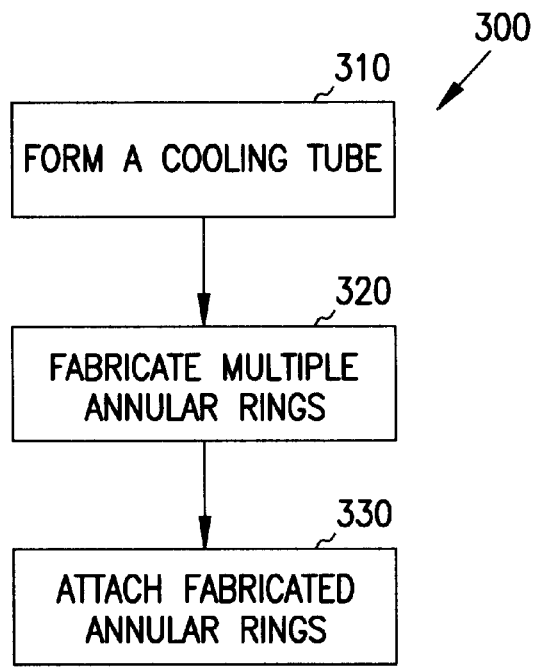
FIG. 3 is a flow diagram illustrating the fabrication of the embodiment shown in FIG. 2.

FIG. 3 is a flow diagram of an example embodiment of a method 300 for fabricating a cylindrical sputter target for a rotary cylindrical cathode. In this example embodiment shown in FIG. 3, the method 300 begins with the step 310 of forming a cooling tube having a passage within to receive a cooling medium. In some embodiments, the cooling tube is made of stainless steel material. In some embodiments, the cooling tube can have an outer diameter of greater than or equal to ½ an inch. In other embodiments, a cooling medium such as water is introduced through the passage to lower the temperature of the rotary cylindrical cathode during the sputtering operation.

Step 320 includes fabricating multiple annular rings using each of the basic metal constituents of a layer of a desired alloy to be sputtered on to a substrate. In some embodiments, the alloy is a brittle material such as CoCrPtB. In some embodiments the alloy can be made from materials such as iron, cobalt, chromium, platinum, chrome alloy, cobalt alloy, and boron. It is generally not economical to fabricate the annular rings directly from the brittle alloy such as CoCrPtB. Therefore the present invention teaches an economically feasible way of fabricating a cylindrical cathode including annular rings fabricated from each of the basic metal constituents of the alloy. In some embodiments, a ring made of cobalt material is fabricated by machining a cobalt sheet material to produce the cobalt annular ring. In some embodiments, a ring made of platinum material is fabricated by stamping a platinum sheet material to produce the platinum annular ring. In some embodiments, a ring made of boron material is fabricated by machining a block of boron material to produce the boron annular ring. In some embodiments, a ring made of chromium material is fabricated by mixing boron and cobalt powdered elements in a metal container and sealing the mixture of the powdered elements in the container, then pressing the container including the mixture of the powdered elements at a high temperature to sinter and form an ingot of chromium. Then sheets of chromium are formed by rolling the chromium ingot and the sheets of chromium are cut to produce the chromium annular ring.

Step 330 includes attaching the fabricated annular rings over the cooling tube such that the exposed portions of the annular rings provide a homogeneous layer of the desired alloy on the substrate when used as the rotary cylindrical cathode during sputtering operation. In some embodiments, the annular rings are attached by threading the outer ends of the cooling tube to threadedly engage a pair of clamping nuts, and arranging the fabricated annular rings including each of the metal constituents of the desired alloy such that the arranged annular rings provide a homogeneous layer of a desired alloy on the substrate during sputtering. Then the arranged fabricated annular rings are disposed over the cooling tube and the annular rings are clamped by threading the clamping nuts over the threaded outer ends of the cooling tube to hold the annular rings in-place. In some embodiments, the clamping nuts are tightened such that the annular rings are compressed to form a mechanical seal between the annular rings to prevent soldering material from wicking during soldering to further bond the cooling tube to the annular rings. In some embodiments, the annular rings are further bonded to the cooling tube using indium solder. Indium is used as the soldering material because indium melts at low temperatures, is soft and does not over-stress the formed solder joint. Further, the indium soldering material produces a better solder joint because indium has better wetting properties than traditional soldering materials.

Figure 4:
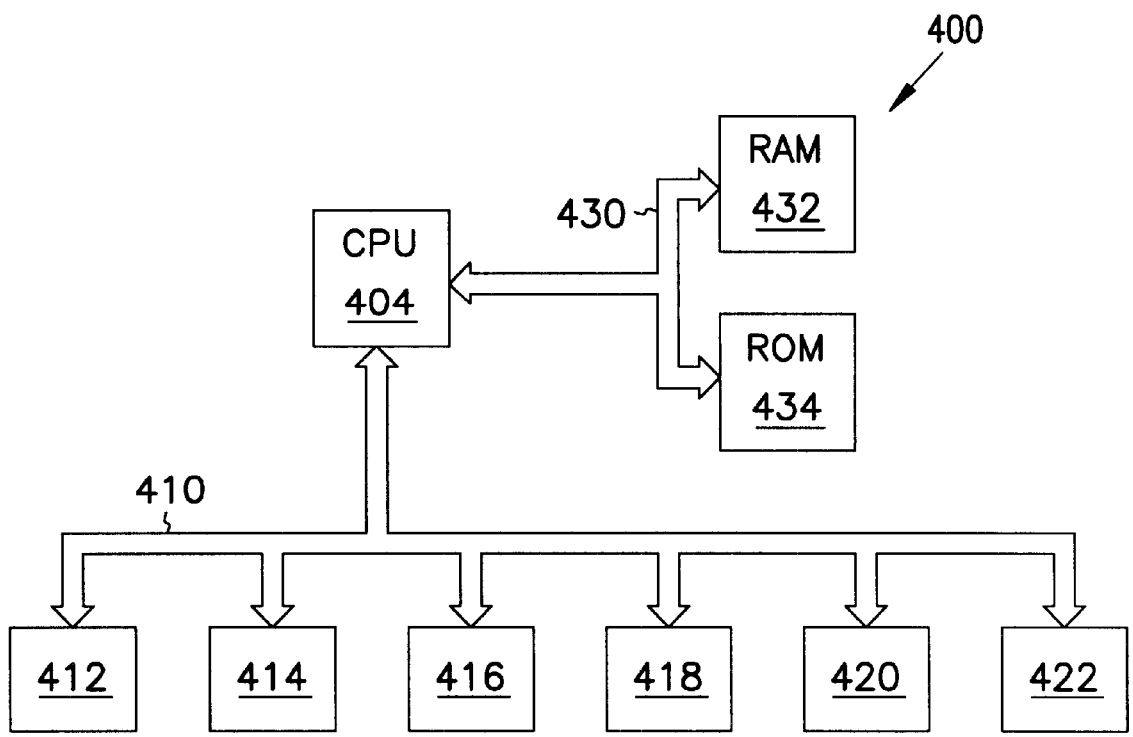
FIG. 4 is a schematic view of a computer system.

FIG. 4 is a schematic view of a computer system. Advantageously, the invention is well suited for use in a computer system 400. The computer system 400 may also be called an electronic system or an information handling system and includes a central processing unit, a memory and a system bus. The information handling system includes a central processing unit 404, a random access memory 432, and a system bus 430 for communicatively coupling the central processing unit 404, a read only memory 434 and the random access memory 432. The information handling system may also include an input/output bus 410 and several peripheral devices, such as 412, 414, 416, 418, 420, and 422 that may be attached to the input output bus 410. Peripheral devices may include hard disc drives, magneto-optical drives, floppy disc drives, monitors, keyboards and other such peripherals. Any type of disc drive may include a storage disc including a thin layer of material deposited according to the teachings of the present invention.

Conclusion

In conclusion, a method 300 is described to fabricate a cylindrical sputter target for a rotary cylindrical cathode. In this example embodiment shown in FIG. 3, the method 300 begins with the step 310 of forming a cooling tube having a passage within to receive a cooling medium.

Step 320 includes fabricating multiple annular rings using each of the basic metal constituents of a layer of desired alloy to be sputtered on a substrate. In some embodiments, the annular rings are made using each of the basic metal constituents of a brittle alloy material such as CoCrPtB, which includes cobalt, chromium, platinum, and boron.

Step 330 includes attaching the fabricated annular rings over the formed cooling tube such that the exposed portion of the annular rings provide a homogeneous layer of the desired alloy on the substrate when used as the rotary cylindrical cathode during the sputtering operation. In some embodiments, the annular rings are attached to the cooling tube by threading the outer ends of the cooling tube and using a pair of clamping nuts to hold the disposed annular rings in-place over the cooling tube. In some embodiments, the annular rings are compressed using the pair of clamping nuts such that the compressed annular rings form a mechanical seal between the annular rings to prevent soldering material from wicking between the annular rings during soldering to further bond the cooling tube with the annular rings. The present invention teaches an economically feasible fabrication technique to form the annular rings of each of the basic metal constituents of the brittle alloy material CoCrPtB and attach the formed annular rings to the cooling tube to form the cylindrical cathode.

Also discussed is a cylindrical cathode 100 for a sputter target. The cylindrical target includes a cooling tube 210, multiple annular rings 220, and a pair of clamping nuts to hold the annular rings in-place over the cooling tube 210.

In the example embodiment shown in FIG. 2, the cooling tube 210 has a passage 214 within to receive a cooling medium to extract heat from the cylindrical cathode 100 during sputtering operation. Also shown in FIG. 2 is the cooling tube 210 having an outer surface 212. In some embodiments, the cooling tube 210 can be made from materials such as stainless steel. In the embodiment shown in FIG. 2, the cooling tube 210 has threaded outer ends 230 to threadedly engage a pair of clamping nuts.

The multiple annular rings 220 shown in FIG. 2 are fabricated using each of the basic metal constituents of a desired alloy on a substrate during sputtering. It can be envisioned that the outer shape of the annular rings 220 is not limited to a circular shape as shown in FIG. 2. The formed annular rings 220 further have inner and outer ring surfaces 222, and 224, respectively.

The annular rings 220 are attached to the cooling tube 210 in the arranged pattern to form an economically feasible cylindrical (non-planar) sputter target 200 for a rotary cylindrical cathode. In some embodiments, the annular rings are 220 are attached to the cooling tube 210 such that the exposed portions of the annular rings provide a homogeneous layer of a desired alloy on the substrate during sputtering.

In the example embodiment shown in FIG. 2 the arranged annular rings 220 are attached to the cooling tube 210 using a pair of clamping nuts 240. The clamping nuts 240 are threadedly engaged to the threads on the outer ends 230 of the cooling tube 210. In some embodiments the clamping nuts 240 are tightened such that the annular rings 220 are compressed to form a mechanical seal between the annular rings to prevent any solder from wicking between the annular rings 220 during soldering to further bond the inner ring surfaces 222 to the outer surface 212 of the cooling tube 210.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of fabricating a cylindrical sputter target for a rotary cylindrical cathode, comprising:

(a) forming a cooling tube having a passage within to receive a cooling medium;

(b) fabricating multiple annular rings using each basic metal constituent of a layer of desired alloy to be sputtered onto a substrate; and (c) attaching the fabricated annular rings over the cooling tube such that an exposed portion of the annular rings provide a homogeneous layer of the desired alloy on the substrate when used as the rotary cylindrical cathode during sputtering.

2. The method of claim 1, wherein the attaching step (c) further comprises:

(c)(i) threading outer ends of the cooling tube to threadedly engage a pair of clamping nuts;

(c)(ii) arranging the fabricated annular rings including each of the metal constituents of the desired alloy such that the arranged annular rings provide a homogeneous layer of a desired alloy on the substrate during sputtering;

(c)(iii) disposing the arranged fabricated annular rings over the formed cooling tube; and (c)(iv) clamping the annular rings using the pair of clamping nuts by threadedly engaging the clamping nuts over the threaded outer ends of the cooling tube such that the pair of clamping nuts rigidly hold the annular rings in place.

3. The method of claim 2, wherein the attaching step (c) further comprises:

(c)(v) tightening the clamping nuts to compress the annular rings together to form a mechanical seal between the annular rings to prevent a soldering material from wicking between the annular rings during soldering to further bond the cooling tube to the annular rings; and (c)(vi) soldering the annular rings to the cooling tube to further bond the annular rings to the cooling tube.

4. The method of claim 3, wherein one of the clamping nuts has an opening therein to receive a solder material for the soldering step (c)(vi).

5. The method of claim 3, wherein the desired alloy is made from a brittle material.

6. The method of claim 5, wherein the brittle material comprises CoCrPtB.

7. The method of claim 5, wherein the annular rings are made from materials selected from the group consisting of iron, cobalt, chromium, platinum, chrome alloy, cobalt alloy, and boron.

8. The method of claim 7, wherein the fabricating step (c) further comprises the step of:

(c)(vii) machining a cobalt sheet material to produce the cobalt annular ring.

9. The method of claim 7, wherein the fabricating step (c) further comprises the step of:

(c) (vii) stamping a platinum sheet material to produce the platinum annular ring.

10. The method of claim 7, wherein the fabricating step (c) further comprises the step of:

(c)(vii) machining a block of boron material to produce the boron annular ring.

11. The method of claim 7, wherein fabricating step (c) further comprises the steps of:
- (c)(vii) mixing boron and cobalt powdered elements in a metal container;
- (c)(viii) sealing the mixture of the powdered elements in the container;
- (c)(ix) pressing the container including the mixture of the powdered elements at a high temperature to sinter and form an ingot of the mixture of powdered elements;
- (c)(x) forming sheets of the mixture of powdered elements by rolling the ingot; and
- (c)(xi) cutting the sheets of the mixture of powdered elements to produce the annular ring.

12. The method of claim 1, wherein the annular rings have an outside diameter of greater than or equal to ½ an inch.

13. The method of claim 1, wherein the forming step (a) further includes the step of (a)(i) forming the cooling tube of a stainless steel material.

14. The method of claim 1, wherein the cooling medium is water.

15. A rotary cylindrical cathode for a sputter target, comprising:
- a cooling tube having a passage within to receive a cooling medium, wherein the cooling tube has an outer surface; and
- a plurality of annular rings having inner and outer ring surfaces, the annular rings made of basic metal constituents of a desired alloy, wherein the inner ring surface of the annular rings are arranged and disposed over the outer surface of the cooling tube such that the outer ring surfaces of the annular rings provide a substantially homogeneous layer of the desired alloy on a non-planar substrate during sputtering.

16. The cathode of claim 15, wherein the cooling tube further comprises:
- a first threaded outer end; and
- a second threaded outer end.

17. The cathode of claim 16, further comprising:
- a first clamping nut; and
- a second clamping nut;
- the first and second clamping nuts are threadedly engaged with the first and second threaded outer ends of the cooling tube to clamp and hold the disposed annular rings rigidly over the outer surface of the cooling tube such that a seal is formed between the plurality of annular rings to prevent solder from wicking between the plurality of annular rings as the inner ring surfaces of the plurality of annular rings are soldered to the outer surface of the cooling tube.

18. The cathode of claim 17, wherein one of the first and second clamping nuts has an opening to receive an indium solder to solder the inner ring surfaces of the annular rings to the outer surface of the cooling tube, such that the indium solder does not wick between the plurality of annular rings during soldering.

19. The cathode of claim 17, wherein the plurality of annular rings are made from materials selected from the group consisting of iron, cobalt, chromium, platinum, chrome alloy, cobalt alloy, and boron.

* * * * *